United States Patent [19]

Schuster-Wolden et al.

[11] 4,385,976
[45] May 31, 1983

[54] SOLDERABLE LAYER SYSTEM, ITS USE AND METHOD FOR MANUFACTURING SAME

[75] Inventors: Hans Schuster-Wolden, Wörthsee; Helmut Freller, Röthenbach; Hans Krüger, Munich; Wolfgang Welsch, Baldham; Andre Peetermans, Poing; Hans J. Rölke, Munich; Peter Schack, Nuremberg, all of Fed. Rep. of Germany

[73] Assignee: Siemens AG, Berlin & Munich, Fed. Rep. of Germany

[21] Appl. No.: 410,467

[22] Filed: Aug. 23, 1982

[30] Foreign Application Priority Data

Sep. 16, 1981 [DE] Fed. Rep. of Germany ....... 3136794

[51] Int. Cl.³ .................... C23C 15/00; G02F 1/13
[52] U.S. Cl. .............. 204/192 P; 204/192 C; 350/343
[58] Field of Search ............. 204/192 D, 192 C

[56] References Cited

U.S. PATENT DOCUMENTS

| | | | |
|---|---|---|---|
| 3,749,658 | 7/1973 | Vossen | 204/192 P |
| 4,106,860 | 8/1978 | Kaufmann | 350/343 |
| 4,231,808 | 11/1980 | Tabei et al. | 204/192 P |
| 4,248,687 | 2/1981 | Fan | 204/192 P |
| 4,269,919 | 5/1981 | Kekuehnle | 204/192 P |

FOREIGN PATENT DOCUMENTS

1381429 1/1975 United Kingdom .

OTHER PUBLICATIONS

Smith et al., J. Electro Chem. Soc. 128, 1981, p. 2388-4.

*Primary Examiner*—Arthur P. Demers
*Attorney, Agent, or Firm*—Herbert L. Lerner; Laurence A. Greenberg

[57] ABSTRACT

In order to bring about durable solder joints on transparent thin film electrodes which themselves are not solderable, the conductive layer is treated as follows. First, the conductive layer is applied in a vacuum and, more specifically, in the fully oxidized state, and then a solderable layer is generated on the conductive layer in the same vacuum. The electrode consists preferably of an indiumtin oxide and the solder layer consists of copper. The proposed coating technique is particularly simple since the solder layer requires neither an adhesion aid nor a corrosion protection layer. If it consists of copper, it can withstand without difficulty, if it is thick enough, even small thermal stresses such as occur for instance in the fabrication of liquid crystal displays with cementing frame.

The layer system is particularly well suited for the electrode leads of electro-optical displays such as liquid crystal displays.

21 Claims, 1 Drawing Figure

U.S. Patent          May 31, 1983          4,385,976
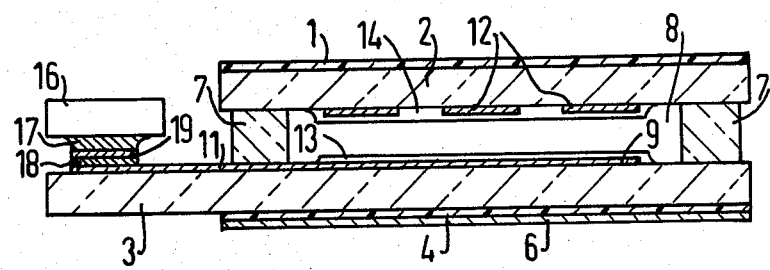

SOLDERABLE LAYER SYSTEM, ITS USE AND METHOD FOR MANUFACTURING SAME

BACKGROUND OF THE INVENTION

The invention relates to a method for the preparation of a solderable layer system with an electrically conductive fully oxidized layer (conductive layer) on an indium and/or tin base, and a solderable layer (solder layer), where the conductive layer is applied first to a support and then the solder layer is applied to the conductive layer.

Transparent thin-film electrodes usually consist of a material that is not wetted by solders of the usual composition. They must therefore be prepared specially if a usable solder joint is to be made. The technological problems arising in this connection are basically solved. Thus, a method has found acceptance, for instance, in which the conducting layer is first coated with an adhesion-aid layer, then with a layer of solder, and finally, with a protective layer. The adhesion aid takes care of providing a firm hold of the solder layer, and the protective layer prevents corrosion of the solderable material. A typical order of layers in this connection is CrCuAu see German Published Prosecuted Application DE-AS No. 23 33 206 (British Patent Specification No. 1,381,429) or German Published Non-Prosecuted Application DE-OS No. 23 50 000 (U.S. Pat. No. 4,106,860).

Such a layer build-up takes care of a strong low-resistance solder joint but is relatively complicated and expensive. These disadvantages come to bear particularly if as in liquid crystal displays, economic consideration play a central role.

In a simpler coating method, the substrate is first given a partially oxidized electrode which is then coated with copper or iron which in turn is surrounded by a protective layer of a corrosive metal such as silicon, tin or indium; subsequently the electrode is fully oxidized at temperatures above 400° C. in order to make it sufficiently transparent and conductive. The high temperature treatment also has the effect of completely oxidizing the protective layer and the solder layer enters into a strong bond with the electrode by diffusion. In this manner good results are obtained without adhesion aids and noble metals. It is found, however, that the conductive layer does not assume an etching behavior which is easy to control, if there is a pronounced copper or iron diffusion. In addition, a special protective film is still necessary which, however, can fulfill its function reliably only if it is so thick that it no longer allows the solder to get into the layer below and therefore must be etched off.

The manufacture can be made still more efficient if the procedure is as follows: the electrode is coated with a solder layer which already contains a share of corrosive metal and the conductive layer is then converted into its oxides. During the heat treatment required therefore, the corrodable addition oxidizes at the surface of the solder layer, so that a protective skin is formed by itself. This variant affords considerable advantages in production but in practice is not without problems. The oxide-rich outside regions of the solder layer sometimes have too weak a blocking effect, and the solder contact can be stressed mechanically only little in some cases, even if the heavily oxide containing solder layer zones are removed. Apart from that, there is also the danger here that the conductive layer cannot be etched in a defined manner.

SUMMARY OF THE INVENTION

An object of the invention is to provide a method for the manufacture of a solderable layer system of the type mentioned at the outset such that the conductive layer exhibits a reproducible etching behavior and the solder layer can be protected in a simple manner.

With the foregoing and other objects in view, there is provided in accordance with the invention a method for the preparation of a solderable layer system with an electrically conductive layer which comprises first applying in a vacuum an electrically conductive layer of a completely oxidized metal selected from the group consisting of $In_2O_3$ and $SnO_2$, to a support, then applying, likewise in a vacuum, a solderable layer to the electrically conductive layer and maintaining a vacuum on the support and applied electrically conductive layer during the entire period between the first application of the conductive layer and the second application of the solderable layer.

Other features which are considered as characteristic for the invention are set forth in the appended claims.

Although the invention is illustrated and described herein as embodied in a solderable layer system, its use and method for manufacturing same, it is nevertheless not intended to be limited to the details shown, since various modifications may be made therein without departing from the spirit of the invention and within the scope and range of equivalents of the claims.

BRIEF DESCRIPTION OF THE DRAWING

The invention, however, together with additional objects and advantages thereof will be best understood from the following description when read in connection with the accompanying drawings which diagrammatically illustrates a liquid crystal system, shown in cross section. The rear support plate of the liquid crystal system protrudes laterally. On its surface is an indium tin oxide layer, then a copper layer on which is applied a nickel layer.

DETAILED DESCRIPTION OF THE INVENTION

According to the invention, the conductive layer and the solder layer are each applied in a vacuum to a support. The conductive layer is applied in a fully oxidized state and the vacuum is maintained between the two coating steps.

In the method in accordance with the invention, the solderable layer is no longer subjected to high temperatures since it is applied on a conductive layer which has the required degree of oxidation. This means that the solder layer basically no longer needs corrosion protection. If the layer consists of copper, it even can stand small thermal loads if the thickness is sufficient. This is particularly valuable since the entire unit must frequently be brought to higher temperatures for other reasons and the layer system is then unavoidably heated. Thus, for instance modern liquid crystal displays are given a plastic cementing frame which hardens at temperatures between 120° C. and 170° C. Under these conditions, a copper layer which is at least two $\mu m$ thick retains its solderability.

Since the solderable material may now only be heated moderately, it can practically no longer get alloyed into the electrode. Thus, there is no danger of etching faults.

It should be noted that the bond between the solder and the conductive layer is sufficiently strong. For, it has been found that the observed adhesion problems occur only if the electrode has come into contact with air before applying the soldering layer. If this is prevented, as provided in accordance with the invention, no additional consolidation means are required. In addition, simple protective measures provide means for the solder layer not suffering noticeable corrosion damage even if heat acts strongly thereon and/or if the layer thickness is relatively small.

Thus, the solder layer is coated with a persistent protective layer protecting the solder layer against corrosion. The layer system obtained in this manner is soldered together. Persistent protective layers may be a nickel layer 10 μm to 100 nm thick and in particular 25 nm to 35 nm thick; a tin layer 6 nm to 100 nm thick and in particular 8 nm to 20 nm thick with an addition of 4% by weight silver; an indium/tin layer 10 nm to 100 nm thick; a tin/antimony layer 10 nm to 100 nm thick; a layer of a platinum metal, particularly palladium; and a gold layer.

The solder layer may be coated with a temporary protective layer protecting the solder layer against corrosion. The temporary protective layer is removed prior to soldering. A temporary protective layer may be a $WO_3$ layer 50 μm to 300 nm thick which layer is removed by an alkaline etching medium. The protective layer of $WO_3$ is dissolved by a photoresist developer and is resistant to photoresist remover. It is therefore recommended for use particularly in liquid crystal displays, of which the electrodes are structured photolithographically and their orientation layers are treated with alkali. In individual cases, a protective layer of $B_2O_3$ 50 nm to 250 nm thick is also available. The $B_2O_3$ can be rinsed off with water without effort. The layers of nickel, tin, indium/tin, or tin/antimony may be vapor deposited, supttered on or generated by electroplating, and the layers of a platinum metal or gold can be applied by electroplating. Tungsten oxide and boron oxide can be vapor deposited or be applied in a centrifuge or by an immersion technique.

The method in accordance with the invention will now be explained with the aid of an embodiment example in conjunction with the accompanying drawing.

The drawing shows in a schematized lateral cross section, a liquid crystal system which operates according to the principle of the so-called "rotational cell" (German Published Prosecuted Application DE-AS No. 21 58 563). The display contains in detail a linear front polarizer 1, a front support plate (front plate) 2, a rear support plate (rear plate) 3, a rear linear polarizer 4 which is crossed relative to the front one, and a reflector 6. The two substrates are connected to each other tightly via a frame 7, at a predetermined distance. The space enclosed by the frame and the two plates is filled with a liquid crystal layer 8. The plates are provided on their surfaces facing each other with respective electrodes (continuous electrode 9 with leads 11, separate controllable segment electrodes 12) as well as with an orientation layer 13, 14. The rear plate 3 protrudes laterally over the front plate 2 and carries at its overhanging region, a drive unit which contains a number of electronic components and is indicated by a block designated 16. The components which may, for instance, be micro-pack driver-IC's, rest on solder supports 17 which serve for securing as well as for providing electrical contact with the electrode leads.

The solder contacts are prepared as follows: first, an indium tin oxide ("ITO") layer is applied to the support plate by reactive RF sputtering, which is described in greater detail, for instance, in RCA Review 32 (1971), Page 289. In the present case, the ITO layer has a thickness of 25 nm and an $In_2O_3$ content of 90% by weight. Then, a copper layer 18 at least 1 μm thick is sputtered on in the same facility and without interrupting the vacuum. A nickel layer 19, 0.3 μm thick can be applied. Thereupon, the carrier plate is finished and cemented to a further plate, where the frame 7 is held for about 20 minutes at a temperature of about 180° C. Thereupon, the triple layer is provided with solder in the usual manner, for instance by immersion into a solder bath. The solder here consists of a tin base alloy.

The copper layer is so thick that it can stand at least three solder operations. It is therefore possible to replace defective components. The nickel layer is not attacked by the hardening process; it can itself be soldered and remain on the copper substrate. The nickel coating also improves the corrosion protection in the regions of the layer system which have remained untinned.

If the electrode is to be configured in the simplest manner possible, the solder layer should first be put in place in a vacuum merely in a thickness between 100 nm and 400 nm; then the desired pattern is to be generated and reinforced subsequently by electroplating or chemically.

The invention is not limited to the embodiment example shown. Thus, it is left to one skilled in the art to select another conductive/solder layer combination which better meets the requirements of the individual case. Thus, iron could be used instead of copper or, instead of an ITO layer, a (doped) indium or tin oxide can be used. In this connection it also does not matter whether layers are sputtered on or vapor deposited.

There are claimed:

1. Method for the preparation of a solderable layer system with an electrically conductive layer which comprises first applying in a vacuum an electrically conductive layer of a completely oxidized metal selected from the group consisting of $In_2O_3$ and $SnO_2$, to a support, then applying, likewise in a vacuum, a solderable layer to the electrically conductive layer, and maintaining a vacuum on the support and applied electrically conductive layer during the entire period between the first application of the conductive layer and the second application of the solderable layer.

2. Method according to claim 1, wherein the conductive layer is $In_2O_3$-$SnO_3$ and is applied by sputtering.

3. Method according to claim 1, wherein the solderable layer is copper and is applied by sputtering.

4. Method according to claim 1, wherein the solderable layer is reinforced by addition to the solderable layer by electroplating or chemically.

5. Method according to claim 3, wherein the solderable layer is reinforced by addition to the solderable layer by electroplating or chemically.

6. Method according to claim 1, wherein the solderable layer has a minimum thickness of 1 μm.

7. Method according to claim 6, wherein the thickness is 2 μm to 3 μm.

8. Method according to claim 1, wherein the solderable layer is coated with a persistent protective layer protecting the solderable layer against corrosion.

9. Method in accordance with claim 8, wherein the persistent protective layer is a nickel layer 10 nm to 100 nm thick and in particular 25 nm to 35 nm thick.

10. Method in accordance with claim 8, wherein the persistent protective layer is a nickel layer 25 nm to 35 nm thick.

11. Method in accordance with claim 8, wherein the persistent protective layer is a tin layer 6 nm to 100 nm thick with an addition of 4% by weight silver.

12. Method in accordance with claim 8, wherein the persistent protective layer is a tin layer 8 nm to 20 nm thick with an addition of 4% by weight silver.

13. Method in accordance with claim 8, wherein the persistent protective layer is an indium/tin layer 10 nm to 100 nm thick.

14. Method in accordance with claim 8, wherein the persistent protective layer is a tin/antimony layer 10 nm to 100 nm thick.

15. Method in accordance with claim 8, wherein the persistent protective layer consists of a metal selected from the group consisting of palladium, platinum, indium, osmium, ruthenium and rhodium.

16. Metal according to claim 15 wherein said metal is palladium.

17. Method in accordance with claim 8, wherein the persistent protective layer consists of gold.

18. Method according to claim 1, wherein the solderable layer is coated with a temporary protective layer protecting the solderable layer against corrosion, and wherein the temporary protective layer is removed prior to soldering.

19. Method according to claim 1, wherein the solderable layer is coated with a $WO_3$ protective layer 50 nm to 300 nm thick and wherein this layer is removed by an alkaline etching medium.

20. Method according to claim 1, wherein the solderable layer is coated with a $B_2O_3$ protective layer 50 nm to 250 nm thick, and wherein this layer is removed with water.

21. Method according to claim 1, wherein the solderable layer is applied to a thin layer electrode in an electrooptical display device, particularly in a liquid crystal display with support plates cemented together.

* * * * *